United States Patent
Wuidart et al.

(10) Patent No.: US 6,836,430 B2
(45) Date of Patent: Dec. 28, 2004

(54) EXTRACTION OF A BINARY CODE BASED ON PHYSICAL PARAMETERS OF AN INTEGRATED CIRCUIT

(75) Inventors: Luc Wuidart, Pourrieres (FR); Michel Bardouillet, Rousset (FR); Alexandre Malherbe, Trets (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/364,848

(22) Filed: Feb. 11, 2003

(65) Prior Publication Data

US 2003/0151539 A1 Aug. 14, 2003

(30) Foreign Application Priority Data

Feb. 11, 2002  (FR) ............................................. 02 01638

(51) Int. Cl.[7] .............................................. G11C 16/04
(52) U.S. Cl. .............................. 365/185.01; 365/185.26
(58) Field of Search ................................. 341/136, 134; 327/215, 214, 199, 219, 217, 202; 365/185.01, 185.07, 185.08, 185.26

(56) References Cited

U.S. PATENT DOCUMENTS

| | | |
|---|---|---|
| 3,636,530 A | 1/1972 | Mark et al. |
| 3,911,368 A | 10/1975 | Tarczy-Hornoch |
| 4,023,110 A | 5/1977 | Oliver |
| 5,608,645 A | 3/1997 | Spyrou |
| 5,686,850 A | 11/1997 | Takaki et al. |
| 6,122,191 A * | 9/2000 | Hirose et al. .......... 365/185.01 |
| 6,363,011 B1 * | 3/2002 | Hirose et al. .......... 365/185.07 |
| 2001/0050952 A1 | 12/2001 | Nikutta |

FOREIGN PATENT DOCUMENTS

| | | |
|---|---|---|
| EP | 0 863 546 A1 | 9/1998 |
| GB | 2 107 541 A | 4/1983 |

OTHER PUBLICATIONS

International Search Report form corresponding PCT application No. PCT/FR03/00444, no date.
French Search Report from French Patent Application No. 02/0163842, filed Feb. 11, 2002.

* cited by examiner

*Primary Examiner*—Brian Young
*Assistant Examiner*—John B Nguyen
(74) *Attorney, Agent, or Firm*—Lisa K. Jorgenson; William R. McClellan; Wolf, Greenfield & Sacks P.C.

(57) ABSTRACT

An extraction method and an integrated cell for extracting a binary value based on a propagation of an edge of a triggering signal in two electric paths, including across two voltage supply terminals: two parallel branches each including, in series, a resistor for differentiating the electric paths; a read transistor, the junction point of the resistor and of the read transistor of each branch defining an output terminal of the cell, and the gate of the read transistor of each branch being connected to the output terminal of the other branch; and a selection transistor.

9 Claims, 2 Drawing Sheets

EXTRACTION OF A BINARY CODE BASED ON PHYSICAL PARAMETERS OF AN INTEGRATED CIRCUIT

BACKGROUND OF THE INVENTION

1. Field of the Invention

The present invention relates to the storing, in an integrated circuit, of an unchangeable binary code. The present invention more specifically relates to the extracting, from an integrated circuit, of a binary code resulting from parameters linked to the manufacturing of this circuit. Such parameters linked to the manufacturing are generally called physical parameters and are then provided by a physical parameter network (PPN). Such an "embedded" binary code is used in an integrated circuit, for example, to avoid its permanent storage in the form of a digital word in a register or the like and to prevent detection of this code. In an application to the identification of an electronic element or assembly based on parameters linked to the manufacturing of an identification circuit contained in an integrated circuit chip, this identification is currently designated as an "integrated circuit fingerprint".

2. Discussion of the Related Art

The present invention more specifically relates to the extraction of a binary code stored in the form of at least partially resistive electric paths and interpreted by flip-flops or the like. Example of circuits for storing such binary codes and of identification of an integrated circuit chip by such codes are described in French patent applications No. 01/04583 and 01/04585 of the assignee, which are incorporated herein by reference.

The principle used by these circuits is to have a same electric edge triggering a reading circulate in different electric paths reaching different flip-flops. According to whether the delay of a given path is shorter or longer than a reference or average delay synchronizing the flip-flop reading, the output state of the corresponding flip-flop is 0 or 1. The outputs of the different flip-flops then provide the binary code stored in the form of electric paths. These electric paths can be made different simply by the length of the tracks forming them, but it is preferable for them to contain a resistive element (in practice associated with a capacitive element formed of the gates of MOS transistors forming the flip-flops) to form an RC cell.

An important advantage of such a binary code storage is that it is stored, not directly in digital form, but, in a way, in analog form, which makes its piracy more difficult.

In the above-mentioned circuits, to fulfill the aim of making the code stored by the electric paths invisible, it must be ascertained that the paths are not too different (in terms of length) as compared to the electric path providing the reference delay. In the opposite case, there is a risk of enabling optical detection according to whether the path is obviously longer or shorter than the reference path.

Further, in some cases and in a perfectly random and unpredictable manner, an electric path of one of the flip-flops may, when associated with the propagation of the edge in this flip-flop, exhibit exactly the same delay as the average path. There then is a risk, for this flip-flop, to have a non-reproducible output state from one extraction to another of the binary code.

These two imperfections of the above-mentioned storage circuits are due to the use of an average delay to synchronize the flip-flop reading.

SUMMARY OF THE INVENTION

The present invention aims at improving the extraction of a binary code embedded in an integrated circuit.

The present invention also aims at providing a circuit for storing a binary code originating from physical parameters of an integrated circuit, which overcomes the disadvantages of the above-mentioned circuits. More specifically, the present invention aims at avoiding the use of a common reference or average electric path to compare the electric paths associated with the different flip-flops.

The present invention also aims at making the delays introduced by the different electric paths of such a circuit undetectable.

The present invention also aims at providing a solution which is compatible with the technology currently used to form MOS transistors and which, in particular, generates no additional manufacturing step.

To achieve these and other objects, the present invention provides an integrated cell for extracting a binary value based on a propagation of an edge of a triggering signal in two electric paths, comprising, across two terminals of application of a voltage, two parallel branches each comprising, in series:

a resistor for differentiating the electric paths;

a read transistor, the junction point of the resistor and of the read transistor of each branch defining an output terminal of the cell, and the gate of the read transistor of each branch being connected to the output terminal of the other branch; and a selection transistor.

According to an embodiment of the present invention, the resistors are made of polysilicon and are sized to have identical nominal values.

According to an embodiment of the present invention, the cell is associated with a circuit for reading an initial state of the cell and for stabilizing this state by causing a stable and irreversible decrease, in the cell read operating current range, of the value of the resistance associated with the branch outputting a high state.

According to an embodiment of the present invention, said value decrease is caused by temporarily imposing, in the corresponding resistor, the flowing of a current which is greater than the current for which the value of the resistance is maximum.

According to an embodiment of the present invention, each branch further comprises a stabilization transistor connecting its output terminal to said terminal of application of a voltage opposite to that to which the resistor of the involved branch is connected.

According to an embodiment of the present invention, the stabilization transistors are used to cause said decrease in the value of one of the resistors.

According to an embodiment of the present invention, said voltage is chosen between a relatively low read voltage and a relatively high voltage of stabilization of the initial cell state.

According to an embodiment of the present invention, said transistors are N-channel MOS transistors.

According to an embodiment of the present invention, said transistors are P-channel MOS transistors.

According to an embodiment of the present invention, said resistor for differentiating the electric paths are passive resistors.

The present invention also provides a method for controlling the stabilization of the value of a cell, comprising the steps of:

causing the reading of an initial state of the cell; and temporarily submitting the resistor which is associated with the branch providing a high output state, to a constraint current greater than a current for which the value of the resistance exhibits a maximum.

According to an embodiment of the present invention, the constraint current is selected from a predetermined table of correspondence between the constraint current and the desired final resistance.

The present invention also provides a circuit for storing and extracting a binary code over n bits in and from an integrated circuit chip, comprising:

n integrated cells of extraction of a binary value; and a central control unit.

According to an embodiment of the present invention, the n bits contained in the cells are extracted in parallel.

The present invention also provides a circuit for identifying an integrated circuit chip comprising a binary code storage and extraction circuit.

The foregoing objects, features and advantages of the present invention, will be discussed in detail in the following non-limiting description of specific embodiments in connection with the accompanying drawings.

DETAILED DESCRIPTION

The same elements have been designated with the same references in the different drawings. For clarity, only those elements that are necessary to the understanding of the present invention have been shown in the drawings and will be described hereafter. In particular, the different circuits for reading and exploiting the binary wards stored in the circuit according to the present invention have not been detailed. The present invention can be implemented whatever the use made of the binary code depending on the integrated circuit physical parameters. Further, the practical forming of a polysilicon resistor by deposition and etching has not been detailed, the present invention being implementable with a conventionally-formed resistor.

A feature of the present invention is to provide, within each read or extraction element of bistable or flip-flop type providing a bit of an embedded binary code, an electric reference path to be compared with an electric path representative of the embedded bit. More specifically, the present invention provides, for each bit of a binary code stored in the form of electric paths having different time constants, a differential structure of extraction of the corresponding bit.

Figure 1:
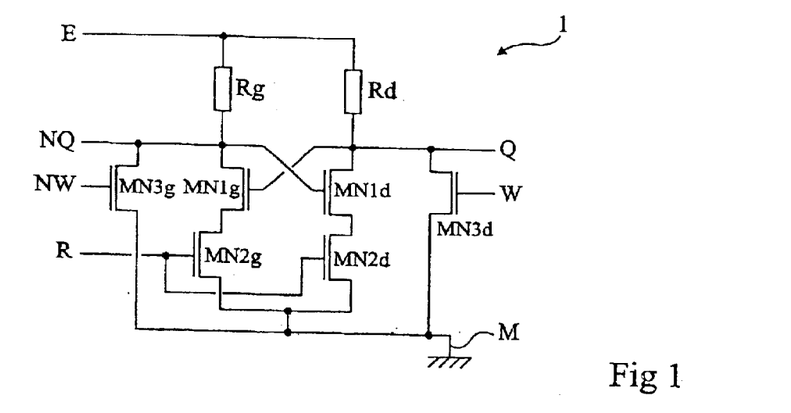
FIG. 1 shows an embodiment of an integrated cell for storing a bit in the form of an electric path according to the present invention.

FIG. 1 shows the electric diagram of a cell 1 for extracting a bit stored in the form of an electric path according to an embodiment of the present invention.

Cell 1 comprises two parallel branches of identical structure between two terminals E and M of application of a voltage, terminal M representing the ground. This voltage which supplies the cell is, as will be seen hereafter, different according to whether an extraction or a reading of the bit, or a characteristic step of stabilization of this bit, are performed.

A first branch, called the right-hand branch in the orientation of the drawing, comprises, in series, a resistor Rd, a first read MOS transistor MN1d, and a second selection MOS transistor MN2d. The interconnection between resistor Rd and transistor MN1d (and thus the drain of this transistor) forms a first output terminal Q arbitrarily called the direct (non-inverted) output terminal. A second branch, called the left-hand branch in the orientation of the drawing, comprises, in series, a resistor Rg, a first read MOS transistor MN1g, and a second selection MOS transistor MN2g. The interconnection between resistor Rg and transistor MN1g (and thus the drain of this transistor) forms a second output terminal NQ which is the inverse of terminal Q. The gate of transistor MN1g is connected to terminal Q while the gate of transistor MN1d is connected to terminal NQ to obtain the desired bistable effect. The gates of transistors MN2g and MN2d are connected together to a terminal R intended to receive a selection signal for reading from cell 1. In the example shown, all the transistors have N channels.

According to the present invention, resistors Rg and Rd are, in their manufacturing, identically sized to have the same value. These resistors belong to the electric paths associated with cell 1. They define, each with the gate of the transistor of the branch opposite to that to which they are respectively connected, an RC cell. These RC cells condition the time constants of the electric paths connecting terminal E to terminals Q and NQ, respectively.

The operation of a cell according to the present invention such as described here above is, in read mode, the following. Input terminal R receives a read configuration or extraction signal (high state), turning on the two transistors MN2g and MN2d.

Afterwards, an edge (positive with the biasing of this embodiment) is applied on input E of the cell described here above. The occurrence of this edge on terminals Q and NQ should be simultaneous if the components were all strictly identical. In practice, such is not the case, if only due to technological and manufacturing process dispersions. As a result, one of terminals Q and NQ sees its voltage increase faster than the other. This imbalance turns on one of transistors MN1g and MN1d. Due to the cross coupling of the gates of these transistors, that which is on first is that of which the gate takes part in the electric with the smallest time constant, and thus that of which the drain voltage increases slower than the other. Once on, this transistor MN1 forces its drain (and thus the corresponding output terminal Q or NQ) to ground, which confirms the blocking of the transistor MN1 of the other branch, and thus the high state on the corresponding output terminal.

Assuming that the time constant only differs due to a difference between the resistances (or that the other dispersions are negligible as compared to the value interval between the resistances), the resistance having the lowest value generates a smaller time constant.

The duration of the extraction signal applied on input E is of no importance. It is a two-state "digital" signal, the extraction or the reading being caused, in this example, by the rising edge. Afterwards, the disappearing of this high state turns off the cell supply, and thus the stored bit.

To keep the undetectability of the code and making it independent from technological and manufacturing process dispersions, it is important that resistors Rg and Rd be provided to be identical and that only their dispersion (which, in essence, is non-observable) should condition, at the end of the manufacturing, the bit extracted from the cell. Even if resistors Rg and Rd are strictly identical, the structure of cell 1 imposes that it cannot take an undetermined state. It will necessarily take a state, for example, according to other dispersions (between the transistors, between the paths bringing the edge from terminal E, etc.).

An advantage of the present invention already appears, which is that, to read the content of a cell, no comparison with an element external to the cell is necessary.

To guarantee a reproducibility of the cell state (bit) for each reading, it is provided, according to another feature of the present invention, to stabilize this content upon first reading. In other words, in a starting, first use, configuration phase or the like, a first reading of the bit originating from the physical parameters is performed, after which a cell stabilization step is triggered.

For this purpose, resistors Rg and Rd are, according to a feature of the present invention, polysilicon resistors, the respective values of which can be submitted to an irreversible decrease, as will be discussed hereafter in relation with FIGS. 2 and 3. For the moment, it should only be noted that if resistor Rg or Rd is submitted to a so-called stabilization current, greater than the current for which its value is maximum, the value of its resistance irreversibly decreases when returning to currents comprised in the nominal operating range. The nominal range of the operating currents of a polysilicon resistor used according to the present invention is smaller than some hundred microamperes and, most often, smaller than some ten microamperes. The amplitude of the programming currents is on the order of a few milliamperes.

According to the present invention, the stabilization step comprises submitting to a high current as compared to the operating current range, the resistor of the branch which has, in a first reading, exhibited a high state (thus indicating, in principle, a resistance of smaller value). This then confirms the cell state by notably decreasing the value of this resistance. Of course, the stabilization current must not be applied to the other resistor, which would then undergo an identical value decrease, which would cancel the expected confirmation effect.

To impose, in one of resistors Rg and Rd, a stabilization current greater than the operating currents of this resistor, terminal E is used, in stabilization phase, for the application of a D.C. supply voltage Vp (here, positive). This supply voltage is, according to the present invention, greater than cell use voltage Vr in the read mode, that is, than the high voltage of the edge applied on terminal E. Further, two MOS transistors MN3$d$ and MN3$g$ (in this example, with an N channel), respectively associated with each of the branches by connecting terminal Q, respectively NQ, to ground, are provided. The respective gates of the transistors form two stabilization control input terminals W and NW of the cell. A single one of transistors MN3$g$ and MN3$d$ is intended to be turned on during the stabilization step.

That of transistors MN3$g$ and MN3$d$ which is on short-circuits the two other transistors MN1 and MN2 of the concerned branch, and imposes the flowing of a current through resistor Rg or Rd of this branch. Stabilization voltage Vp is chosen so that the current which then flows through resistor Rg or Rd is greater than the current for which this resistance exhibits a maximum value. This feature of the present invention will better appear from the description which will be made hereafter in relation with FIGS. 2 and 3.

Transistors MN2$g$ and MN2$d$ of the cell must be off in the stabilization phase (input R low). They are used to protect read transistors MN1$g$ and MN2$g$ by making their sources float, thus avoiding the occurrence of destructive gate-source voltages due to supply voltage Vp. Further, by disconnecting transistors MN1, transistors MN2 prevent them from seeing high voltage Vp across their terminals. Accordingly, transistors MN1 and MN2 can be sized according to read voltage Vr. Only transistors MN3$g$ and MN3$d$ need sizing to stand voltage Vp and bear the relatively high current (as compared to the read operating range) used to stabilize the cell.

Figure 2:
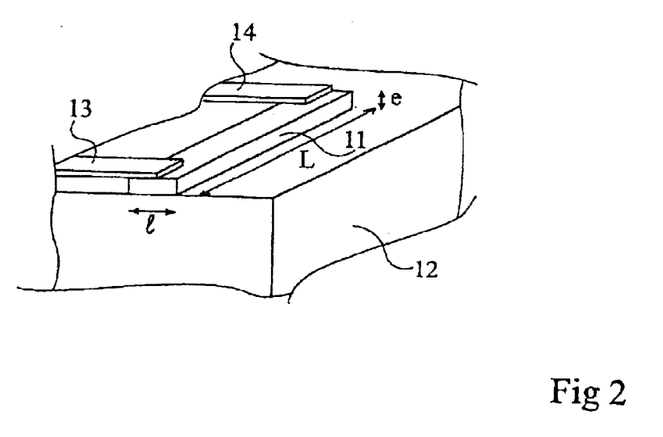
FIG. 2 shows in a partial very simplified perspective view, an embodiment of a polysilicon resistor that constitutes an electric path according to the present invention.

FIG. 2 shows an embodiment of a polysilicon resistor used to form resistors Rd and Rg of a cell according to the present invention.

Such a resistor (designated as 11 in FIG. 2) is formed of a polysilicon track (also called a bar) obtained by etching of a layer deposited on an insulating substrate 12. Substrate 12 is indifferently directly formed of the integrated circuit substrate or is formed of an insulating layer forming an insulating substrate or the like for resistor 11. Resistor 11 is connected, by its two ends, to conductive tracks (for example, metal tracks) 13 and 14 intended to connect the resistive bar to the other integrated circuit elements. The simplified representation of FIG. 2 makes no reference to the different insulating and conductive layers generally forming the integrated circuit. To simplify, only resistive bar 11 laid on insulating substrate 12 and in contact, by the ends of its upper surface, with the two metal tracks 13 and 14, has been shown. In practice, the connections of resistive element 11 to the other integrated circuit components are obtained by wider polysilicon tracks starting from the ends of bar 11, in the alignment thereof. In other words, resistive element 11 is generally formed by making a section of a polysilicon track narrower than the rest of the track.

Resistance R of element 11 is given by the following formula:

$$R=\rho(L/s),$$

where $\rho$ designates the resistivity of the material (polysilicon, possibly doped) forming the track in which element 11 is etched, where L designates the length of element 11, and where s designates its section, that is, its width l by its thickness e. Resistivity $\rho$ of element 11 depends, among others, on the possible doping of the polysilicon forming it.

Most often, upon forming of an integrated circuit, the resistors are provided by referring to a notion of so-called square resistance $R_\square$. This square resistance defines as being the resistivity of the material divided by the thickness with which it is deposited. Taking the above relation giving the resistance of an element 11, the resistance is thus given by the following relation:

$$R=R_\square*L/l.$$

Quotient L/l corresponds to what is called the number of squares forming resistive element 11. This represents, as seen from above, the number of squares of given dimension depending on the technology, put side by side to form element 11.

The value of the polysilicon resistance is thus defined, upon manufacturing, based on the above parameters, resulting in so-called nominal resistivities and resistances. Generally, thickness e of the polysilicon is set by other manufacturing parameters of the integrated circuit. For example, this thickness is set by the thickness desired for the gates of the integrated circuit MOS transistors.

A feature of the present invention is to temporarily impose, in a polysilicon resistor (Rg or Rd), the value of which is desired to be irreversibly decreased, a programming or constraint current greater than a current for which the resistance reaches a maximum value, this current being beyond the normal operating current range (in read mode) of this resistance. In other words, the resistivity of the polysilicon is decreased in the operating current range, in a stable and irreversible manner, by temporarily imposing in the corresponding resistive element the flowing of a current beyond the operating current range.

Another feature of the present invention is that the current used to decrease the resistance value is, conversely to a fusible element, non-destructive for the polysilicon element.

Figure 3:
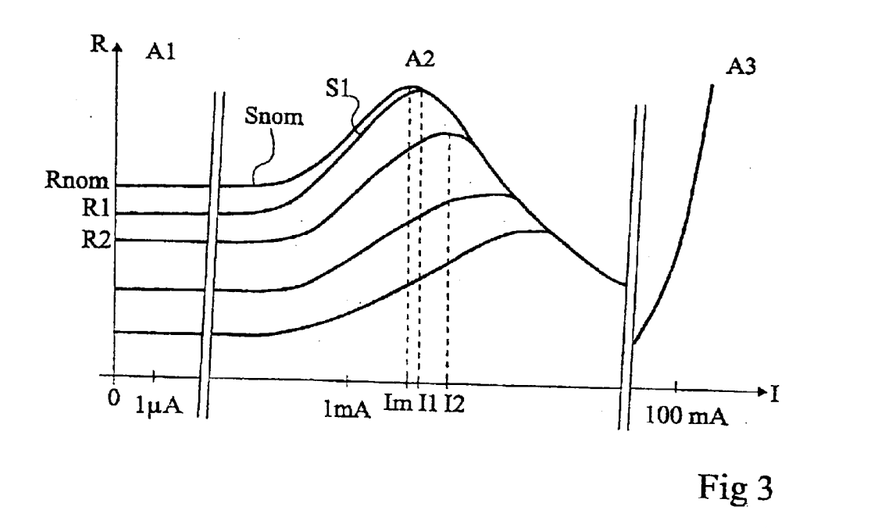
FIG. 3 illustrates, in a curve network, the stabilization of the value of an electric path according to an embodiment of the present invention.

FIG. 3 illustrates, with a curve network giving the resistance of a polysilicon element of the type shown in FIG. 2 according to the current flowing therethrough, an embodiment of the present invention for stabilizing a cell by decreasing the value of one of its resistors.

It is assumed that the polysilicon having been used to manufacture resistive element 11 (Rg or Rd) exhibits a nominal resistivity giving element 11, for the given dimensions l, L, and e, a resistance value $R_{nom}$. This nominal (original) value of the resistance corresponds to the value taken in a stable manner by resistive element 11 in the operating current range of the system, that is, generally, for currents smaller than 100 μA.

According to the present invention, to decrease the value of the resistance and to switch in an irreversible and stable manner, for example, to a value R1 smaller than $R_{nom}$, a so-called constraint current (for example, I1), greater than a current Im for which the value of resistance R of element 11 is maximum without for all this being infinite, is imposed across resistive element 11. As illustrated in FIG. 3, once current I1 has been applied to resistive element 11, a stable resistance of value R1 is obtained in range A1 of operating currents of the integrated circuit. In fact, curve Snom of the resistance according to the current is stable for relatively low currents (smaller than 100 μA). This curve starts increasing for substantially higher currents on the order of a few milliamperes, or even more (range A2). In this current range, curve Snom crosses a maximum for value Im. The resistance then progressively decreases. In FIG. 3, a third range A3 of currents corresponding to the range generally used to make fuses has been illustrated. These are currents on the order of one tenth of an ampere where the resistance starts abruptly increasing to become infinite. Accordingly, it can be considered that the present invention uses intermediary range A2 of currents between operating range A1 and destructive range A3, to irreversibly decrease the value of the resistance or more specifically of the resistivity of the polysilicon element.

Indeed, once the maximum of curve Snom of the resistivity according to the current has been passed, the value taken by the resistance in the operating current range is smaller than value $R_{nom}$. The new value, for example, R1, depends on the higher value of the current (here, I1) which has been applied during the irreversible current phase. It should indeed be noted that the irreversible decrease performed by the present invention occurs in a specific programming phase, outside of the normal extraction operating mode (range A1) of the integrated circuit, that is, outside of the normal operation of the resistor.

Theoretically, once the value of the polysilicon resistance has been lowered to a lower value (for example, R1 in FIG. 3), an irreversible decrease in this value can further be implemented. It is enough to achieve this to exceed maximum current I1 of the new shape S1 of the resistance according to the current. For example, the value of the current may be increased to reach a value I2. When the current is then decreased again, a value R2 is obtained for the resistor in its normal operating range. The value of R2 is smaller than value R1 and, of course, than value $R_{nom}$. In the application to a differential cell for extracting a bit such as shown in FIG. 1, this shows the irreversibility of the introduced stabilization. A second stabilization phase only, at most, increases the decrease in the value of the resistance with respect to its nominal value, and thus only further confirms the state of the first detection.

It can be seen that all the curves of the resistance according to the current join on the decrease slope of the resistance value, after having crossed the maximum of the curve. Thus, for a given resistive element (ρ, L, s), currents I1, I2, etc. which must be reached, to switch to a smaller resistance value, are independent from the value of the resistance (Rnom, R1, R2) from which the decrease is caused.

What has been expressed here above as the resistance value corresponds in fact to a decrease in the resistivity of the polysilicon forming the resistive element. The present inventors consider that the polysilicon crystalline structure is modified in a stable manner and that, in a way, the material is reflowed, the obtained final crystalline structure depending on the maximum current reached.

Of course, it will be clear that the programming current range A2 should not be exceeded (on the order of a few milliamperes) to avoid destroying the polysilicon resistor. This precaution will pose no problem in practice since the use of polysilicon to form a fuse requires much higher currents (on the order of one tenth of an ampere) which are not available once the circuit has been manufactured.

The practical forming of a polysilicon resistor according to the present invention does not differ from the forming of a conventional resistor. Starting from an insulating substrate, a polysilicon layer is deposited and etched according to the dimensions desired for the resistance. Since the deposited polysilicon thickness is generally determined by the technology, the two dimensions which can be adjusted are the width and the length. Generally, an insulator is redeposited on the polysilicon bar thus obtained. In the case of an on-line interconnection, width l will have been modified with respect to the wider access tracks to be more strongly conductive. In the case of an access to the ends of the bar from the top as shown in FIG. 2, vias will be made in the overlying insulator (not shown) of the polysilicon bar to connect contact metal tracks 13 and 14.

In practice, to have the highest resistance adjustment capacity with a minimum constraint current, a minimum thickness and a minimum width will be desired to be used for the resistive elements. In this case, only length L conditions the nominal value of the resistance once the polysilicon structure has been set. The possible doping of the polysilicon, whatever its type, does not hinder the implementation of the present invention. The only difference linked to the doping is the nominal resistivity before constraint and the resistivities obtained for given constraint currents. In other words, for an element of given dimensions, this conditions the starting point of the resistance value, and accordingly the resistance values obtained for given constraint currents.

To be able to apply the right values, the different currents to be applied to switch from the different resistance values to lower values are predetermined, for example, by measurements. For example, a test resistor which is submitted to an increase by steps of the current is used, returning after each increase to the operating current range to measure the obtained resistance value. The measured values will follow curve Snom. Accordingly, the currents (I1, I2, FIG. 3) and the associated resistances (R1, R2) can be determined. The difference between the values of the table so obtained depends on the pitch selected for the increase by steps of the constraint current. This predetermination of course takes into account the nature of the polysilicon used, as well as preferentially that of the square resistance, that is, the resistivity of the material and the thickness with which it is deposited. Indeed, since the curves illustrated in FIG. 3 can also be read as curves of the square resistance, the calculated values can be transposed to the different resistors of an integrated circuit defined by the widths and the lengths of the resistive sections. The value of the constraint current to be applied to the resistive element to decrease its value in an irreversible and stable manner can then be predetermined. This determination enables setting voltage Vp used in the stabilization phase. It should be noted that due to the desired effect (remarkable decrease in the value of one of the two matched resistors), the accuracy of the constraint current is not critical as long as it is greater than maximum current Im of the resistor. Preferably, a comfortable security margin will be taken to avoidvariations of voltage Vp or other circuit tolerances to prevent the value decrease. For example, the circuit will be parameterized according to a stabilization current providing a resistance value smaller than half the nominal value.

The curve change, that is, the decrease in the resistance value in normal operation, is almost immediate as soon as the corresponding constraint current is applied. "Almost immediate" means a duration of a few tens, or even hundreds of microseconds, which are sufficient to apply the corresponding constraint to the polysilicon bar and decrease the value of its resistance. This empirical value depends on the (physical) size of the bar. A duration of a few milliseconds may be chosen for security. Further, it can be considered that, once the minimum duration has been reached, no additional duration of application of the constraint current modifies, at least at the first order, the obtained resistance. Moreover, even if given the predetermination measurements, it is considered that the influence of the duration of application of the constraint cannot be neglected, the preferred embodiment (predetermining constraint values in duration and intensity) is perfectly compatible with the taking into account of the duration of application of the constraint.

As a specific example of embodiment, an N+ doped polysilicon resistor having a cross-section of 0.225 square micrometer (1=0.9 $\mu$m, e=0.25 $\mu$m) and a length L of 45 micrometers has been formed. With the polysilicon used and the corresponding doping, the nominal resistance was approximately 6,300 ohms. This corresponds to a resistance per square of approximately 126 ohms (50 squares). By applying to this resistor a current greater than three milliamperes, a decrease in its value, stable for an operation under currents reaching 500 microamperes, has been caused. With a current of 3.1 milliamperes, the value of the resistance has been lowered to approximately 4,500 ohms. By applying to the resistor a current of 4 milliamperes, the value of the resistance has been decreased down to approximately 3,000 ohms. The obtained resistance values have been the same for constraint durations ranging from 100 microseconds to more than 100 seconds.

Of course, the above examples as well as the given orders of magnitude of currents and resistances for the different ranges concern present technologies. The currents of ranges A1, A2, and A3 may be different (smaller) for more advanced technologies and may be transposed to current densities. The principle of the present invention is not modified by this. There are still three ranges and the intermediary range is used to force the resistivity decrease.

An advantage of the present invention is that it is compatible with conventional MOS transistor manufacturing technologies.

Another advantage of the present invention is that the value integrated in the resistors is not sensitive to ultraviolet rays.

Another advantage of the present invention is that the code stored in the storage element is not optically detectable, conversely to a polysilicon resistor which would be used as a fuse where the physical damage on the silicon bar makes the programming visible.

Another advantage of the present invention is that the irreversible modification of the value of the programmed resistor is not destructive and thus does not risk damaging other circuit parts. This especially enables providing a decrease in the resistance value after manufacturing, and even during its lifetime in its application circuit.

Figure 4:
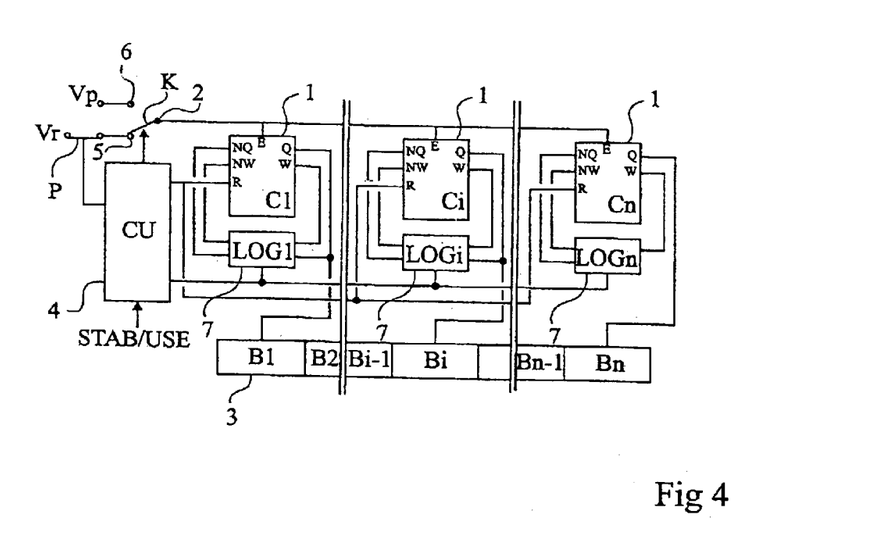
FIG. 4 shows, in the form of blocks, an embodiment of a circuit for storing and extracting a binary code according to the present invention.

FIG. 4 shows the electric diagram of an embodiment of an integrated storage circuit associating several cells 1 of the type of that shown in FIG. 1, to extract a word or a binary code over several bits.

In this example, the circuit comprises a single input terminal 2 of application, according to the operating phase, of voltage Vp or of a read edge at level Vr. The circuit provides a binary code $B_1, B_2, \ldots B_{i-1}, B_i, \ldots, B_{n-1}, B_n$ over a predetermined number n of bits. Each bit $B_i$ is provided by an output (for example, Q) of a cell $C_i$ (i ranging between 1 and n). In the example of FIG. 4, the different Q outputs of flip-flops 1 are individually connected to the input of a register 3 for storing the obtained binary code. The connection and structure details of register 3 have not been shown in detail. Once the binary code is contained in the register, its exploitation depends on the application, and its implementation is within the abilities of those skilled in the art.

The circuit of FIG. 4 comprises a central unit 4 (CU) common to all cells 1. Unit 4 especially has the function of placing all cells in a read or stabilization operation. For example, unit 4 controls a selector K of connection of terminal 2 between a terminal 6 of application of D.C. voltage Vp and a terminal 5 on which will be applied, in read mode, a digital signal (edge of amplitude Vr) for triggering the code extraction. For example, a switch P (for example, a MOS transistor) connects terminal 5 to a terminal of application of voltage Vr.

Unit 4 also generates a control signal for terminals R of cells Ci to place said cells in a read or stabilization configuration, as well as a signal for controlling switch P. In the example shown where the reading is performed in parallel, all terminals R of cells Ci are connected together to the corresponding terminal of unit 4. As an alternative, cells Ci may be individually addressed (for example, cyclically) in read mode, for a series extraction of the different bits. It should then be ascertained to maintain the extraction signal high (turning-on of switch P) for the tine necessary to extract all the bits.

To enable stabilization or confirmation of a cell, it is necessary to extract its content a first time therefrom and accordingly control the conduction of transistor MN3g or MN3d. For this purpose, each cell Ci is associated with a logic read and interpretation circuit 7 (LOGi) in the stabilization phase.

Each circuit 7 comprises two detection inputs respectively connected to terminals Q and NQ of the cell, two control outputs respectively connected to control terminals W and NW of transistors MN3d and MN3g of the cell, and an input control terminal intended to receive a signal for controlling (activating/deactivating) unit 4. To simplify, the input/output terminals of circuit 7 which are connected to cell 1 will be designated with the references of the terminals of this cell. Preferably, the stabilization of all cells is performed in parallel, whereby each one is associated with its logic circuit 7.

When the code must be stabilized, for example, in a first use of the circuit, or in a testing phase after manufacturing, a control signal STAB/USE received by unit 4 starts a stabilization phase.

Unit 4 starts causing an extraction of all bits. To achieve this, it places selector K in a state where it selects terminal 5, turns on transistors MN2 and activates circuits LOGi, then causes a switching to the high state of the signal applied on terminal 5. For this purpose, unit 4 turns on switch P to have a positive edge appear on terminals E of the cells. The time during which switch P is on corresponds to the duration of a normal extraction. In each cell, a state 0 or 1 then appears on its Q output. Preferably, all cells have resistor pairs Rg and Rd of same values.

The stabilization will be described in relation with one cell, knowing however that it is performed similarly for the other cells.

Initially, outputs W and NW of circuits LOGi are idle (low), so that both transistors MN3 are off. As soon as circuit LOGi detects a state 1 on one of its Q, respectively NQ, inputs, it switches its output W, respectively NW, to the high state, to turn on transistor MN3d, respectively, MN3g, and locks this conductive state as well as a low state on its other output NW, respectively, W. This locking of the low state enables freezing the control by circuit LOGi even when the turn-on switching of one of transistors MN3 inverts the state of the cell outputs. As an alternative, it may be provided to disable the detection of the states on the Q and NQ inputs as soon as a high state has been detected on said inputs.

According to a first embodiment corresponding to the shown embodiment, unit 4 starts, after a predetermined time chosen to be longer (with a security margin) than the maximum possible locking duration of the different circuits LOGi (which thus depends on the maximum time constant of the different paths of the cells, in particular if different cells have different nominal values of resistance pairs), the turning-off of transistors MN2 (low state on all inputs R), followed by the switching of selector K to terminal 6. This results in the flowing of a stabilization current (on the order of a few milliamperes) in one of the resistors of each cell (that corresponding to the shortest detected time constant). This current with a value predetermined according to the nominal characteristics of the resistors of cells 1, as discussed in relation with FIG. 3, is maintained, for example, for a duration of a few milliseconds. This causes, in each cell, an irreversible and stable decrease in the value of the resistor associated with the shortest time constant, thus confirming the cell state.

Then, unit 4 deactivates the stabilization phase by switching selector K back to terminal 5 (without however triggering a new extraction by the turning-on of switch P) and by deactivating logic circuits LOGi. Unit 4 may also switch the control signal of inputs R to a high state. As an alternative, this signal is placed in the high state for each extraction phase, which reduces or minimizes the power consumption outside of extraction phases.

The state of each cell is thus now stabilized (confirmed) without for all this being detectable. Indeed, resistors Rd and Rg of each cell still have the same dimensions.

According to an alternative embodiment, each logic circuit LOGi is associated with a selector between levels Vp and Vr and accordingly comprises a control logic. In this case, it is not necessary for all cells to switch to level Vp at the same time.

In principle, the stabilization step is only performed once. However, it is not disturbing for it to be reproduced. It will only confirm the same state.

An advantage of the present invention is that no particular precaution is to be taken to differentiate the electric paths storing the code. On the contrary, the resistors are manufactured identically, which further increases the code dissimulation.

Another advantage of the present invention is that the code thus stored does not risk being detected, even by power analysis. Indeed, the consumption of a cell remains unchanged in read mode, whatever that of resistors Rd and Rg which has seen its value decrease.

Of course, the present invention is likely to have various alterations, modifications, and improvement which will readily occur to those skilled in the art. In particular, the sizing of the polysilicon resistors to obtain a nominal value depends on the application and are within the abilities of those skilled in the art based on the functional indications given here above. Further, the values of the voltage or current constraints to implement the present invention are within the abilities of those skilled in the art based on the functional indications given here above. Further, although the present invention has been described in relation with N-channel MOS transistors, its structure easily transposes to P-channel MOS transistors, the cell resistors being then connected to the lowest (negative) supply potential. Finally, it should be noted that the present invention can easily be transposed from one technology to another.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated cell for extracting a binary value based on a propagation of an edge of a triggering signal in two electric paths, comprising, across two voltage supply terminals, two parallel branches each comprising, in series:
   a resistor for differentiating the electric paths;
   a read transistor, a junction of the resistor and the read transistor of each branch defining an output terminal of the interated cell, and the gate of the read transistor of each branch being connected to the output terminal of the other branch; and
   a selection transistor, wherein the resistors are made of polysilicon and are sized to have identical nominal values and wherein the cell is associated with a circuit for reading an initial state of the cell and for stabilizing this state by causing a stable and irreversible decrease, in the cell read operating current range, of the resistance associated with the branch outputting a high state.

2. The cell of claim 1, wherein said resistance decrease is caused by temporarily imposing, in the corresponding resistor, a current which is greater than the current for which the value of the resistance is maximum.

3. An integrated cell for extracting a binary value based on a propagation of an edge of a triggering signal in two electric paths, comprising, across two voltage supply terminals, two parallel branches each comprising, in series:

a resistor for differentiatinl the electric paths;

a read transistor, a junction of the resistor and the read transistor of each branch defining an output terminal of the integrated cell, and the nate of the read transistor of each branch being connected to the output terminal of the other branch; and a selection transistor, wherein each branch further comprises a stabilization transistor connecting its output terminal to said terminal of application of a voltage opposite to that to which the resistor of the involved branch is connected and wherein the stabilization transistors are used to cause said decrease in the value of one of the resistors.

4. An integrated cell for extracting a binary value based on a propaaation of an edge of a triggering signal in two electric paths, comprising, across two voltage supply terminals, two parallel branches each comprising, in series:

a resistor for differentiating the electric paths;

a read transistor, a junction of the resistor and the read transistor of each branch defining an output terminal of the integrated cell, and the gate of the read transistor of each branch being connected to the output terminal of the other branch; and a selection transistor, wherein said voltage is chosen between a relatively low read voltage and a relatively high voltage of stabilization of the initial cell state.

5. A method for controlling stabilization of a value of an integrated cell, comprising the steps of:

providing an integrated cell for extracting a binary value based on a propagation of an edge of a triggering signal in two electric paths, comprising, across two voltage supply terminals, two parallel branches each comprising, in series:

a resistor for differentiating the electric paths;

a read transistor, a junction of the resistor and the read transistor of each branch defining an output terminal of the integrated cell, and the gate of the read transistor of each branch being connected to the output terminal of the other branch; and a selection transistor;

causing the reading of an initial state of the cell; and temporarily submitting that of the resistors which is associated with the branch providing a high output state, to a constraint current greater than a current for which the value of the resistance exhibits a maximum.

6. The method of claim 5, wherein the constraint current is selected from a predetermined table of correspondence between the constraint current and the desired final resistance.

7. A circuit for storing and extracting a binary code over n bits in and from an integrated circuit chip, comprising:

n cells each comnrising an interated cell for extracting a binary value based on a propagtion of an edge of a triggering signal in two electric paths, comprising, across two voltage supply terminals, two parallel branches each comprising, in series:

a resistor for differentiating the electric paths;

a read transistor, a junction of the resistor and the read transistor of each branch defining an output terminal of the interated cell, and the gate of the read transistor of each branch being connected to the output terminal of the other branch; and a selection transistor; and a central control unit.

8. The circuit of claim 7, wherein the n bits contained in the cells are extracted in parallel.

9. A circuit for identifying an integrated circuit chip comprising the circuit of claim 7.

* * * * *

UNITED STATES PATENT AND TRADEMARK OFFICE
CERTIFICATE OF CORRECTION

PATENT NO. : 6,836,430 B2
DATED : December 28, 2004
INVENTOR(S) : Luc Wuidart, Michel Bardouillet and Alexandre Malherbe It is certified that error appears in the above-identified patent and that said Letters Patent is hereby corrected as shown below:

Column 3,
Line 47, should read -- reading and exploiting the binary words stored in the circuit --

Column 4,
Line 34, should read -- such as described hereabove is, in read mode, the following. --
Lines 39-40, should read -- embodiment) is applied on input E of the cell described hereabove. The occurrence of this edge on terminals Q and NQ --

Column 8,
Line 23, should read -- What has been expressed hereabove as the resistance --

Column 9,
Line 27, should read -- be taken to avoid variations of voltage Vp or other circuit --

Column 10,
Line 63, should read -- high (turning-on of switch P) for the time necessary to extract --

Column 12,
Line 31, should read -- given hereabove. Further, the values of the voltage or --
Line 34, should read -- functional indirections given hereabove. Further, although --
Line 56, should read -- the integrated cell, and the gate of the read transistor of --

Column 13,
Line 7, should read -- a resistor for differentiating the electric paths; --
Line 10, should read -- the integrated cell, and the gate of the read transistor of --
Line 22, should read -- a propagation of an edge of a triggering signal in two electric --

UNITED STATES PATENT AND TRADEMARK OFFICE
CERTIFICATE OF CORRECTION

PATENT NO. : 6,836,430 B2
DATED : December 28, 2004
INVENTOR(S) : Luc Wuidart, Michel Bardouillet and Alexandre Malherbe It is certified that error appears in the above-identified patent and that said Letters Patent is hereby corrected as shown below:

<u>Column 14,</u>
Lines 21-22, should read -- n cells each comprising an integrated cell for extracting a binary value based on a propagation of an edge of a --
Line 30, should read -- the integrated cell, and the gate of the read transistor of --

Signed and Sealed this

Twenty-sixth Day of April, 2005

JON W. DUDAS
*Director of the United States Patent and Trademark Office*